United States Patent
Kondoh (10) Patent No.: US 8,395,136 B2
(45) Date of Patent: Mar. 12, 2013

(54) POSITIONAL DEVIATION DETECTION APPARATUS AND PROCESS SYSTEM EMPLOYING THE SAME

(75) Inventor: Keisuke Kondoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 468 days.

(21) Appl. No.: 12/602,174

(22) PCT Filed: May 22, 2008

(86) PCT No.: PCT/JP2008/059463
§ 371 (c)(1),
(2), (4) Date: Nov. 30, 2009

(87) PCT Pub. No.: WO2008/152895
PCT Pub. Date: Dec. 18, 2008

(65) Prior Publication Data
US 2010/0172720 A1    Jul. 8, 2010

(30) Foreign Application Priority Data

Jun. 12, 2007 (JP) .................................. 2007-155506

(51) Int. Cl.
*G01N 21/86* (2006.01)
*G06M 7/00* (2006.01)
(52) U.S. Cl. .................................. 250/559.33; 250/221
(58) Field of Classification Search .................. 250/221, 250/222.1, 224, 559.12, 559.36, 559.37, 250/206.1, 206.2, 559.4, 559.33; 414/217, 414/217.1, 936–938; 700/214, 258; 156/345.32, 156/345.37; 356/375
See application file for complete search history.

(56) References Cited

U.S. PATENT DOCUMENTS

| | | | |
|---|---|---|---|
| 4,819,167 A | 4/1989 | Cheng et al. | |
| 5,483,138 A | 1/1996 | Shmookler et al. | |
| 5,504,345 A * | 4/1996 | Bartunek et al. | ........... 250/559.4 |
| 6,499,367 B1 | 12/2002 | Saeki | |
| 2004/0067127 A1* | 4/2004 | Hofmeister et al. | ....... 414/744.5 |
| 2006/0287761 A1 | 12/2006 | Ishizawa | |

FOREIGN PATENT DOCUMENTS

| | | |
|---|---|---|
| CN | 1802736 A | 7/2006 |
| JP | 63-094653 | 4/1988 |
| JP | 64-057104 | 3/1989 |
| JP | 06-224284 | 8/1994 |

(Continued)

OTHER PUBLICATIONS

Japanese Office Action mailed Dec. 14, 2010 with partial translation.

(Continued)

*Primary Examiner* — Que T Le
*Assistant Examiner* — Don Williams
(74) *Attorney, Agent, or Firm* — IPUSA, PLLC (57) ABSTRACT

In a positional deviation detection apparatus provided with a transfer mechanism where plural arm portions are connected pivotably and in series with each other, the transfer mechanism being adapted to hold and transfer an object to be processed with a distal end arm portion, there are provided an edge detection unit that detects at least an edge of the object to be detected held by the distal end arm portion, the edge detection unit being provided in an arm portion among the plural arm portions, except for the distal end arm portion; and a positional deviation detection portion that obtains positional deviation of the object to be processed, in accordance with a detected value of the edge detection unit.

12 Claims, 11 Drawing Sheets

FOREIGN PATENT DOCUMENTS

| | | |
|---|---|---|
| JP | 9-115991 | 5/1997 |
| JP | 10-223732 | 8/1998 |
| JP | 10-247681 | 9/1998 |
| JP | 10-335410 | 12/1998 |
| JP | 11-091948 | 4/1999 |
| JP | 2000-012657 | 1/2000 |
| JP | 2002-43394 | 2/2002 |
| JP | 2002-319612 | 10/2002 |
| JP | 2003-179119 | 6/2003 |
| JP | 2004-140147 | 5/2004 |
| JP | 2006-351883 | 12/2006 |
| JP | 2007-095881 | 4/2007 |
| KR | 1020060065627 A | 6/2006 |
| TW | 200502531 A | 1/2005 |
| WO | WO 2005/004227 | 1/2005 |

OTHER PUBLICATIONS

Korean Office Action mailed Sep. 30, 2010 with partial trans.
Chinese Office Action mailed Aug. 17, 2010 with partial trans.
Japanese Office Action mailed Oct. 12, 2010 with partial trans.
Taiwanese Office Action mailed Mar. 7, 2012 with partial translation.

\* cited by examiner

POSITIONAL DEVIATION DETECTION APPARATUS AND PROCESS SYSTEM EMPLOYING THE SAME

TECHNICAL FIELD

The present invention relates to a process system in which an object to be processed such as a semiconductor wafer undergoes a predetermined process and a positional deviation detection apparatus for use in the same.

BACKGROUND ART

Generally, various processes such as film deposition, oxidization/diffusion, etching, annealing and the like are repeatedly carried out in order to fabricate semiconductor integrated circuits (IC). In order to improve process efficiency, a series of the above-mentioned processes are carried out while transferring the wafer from one process chamber after the next in a so-called cluster tool configured in a manner that process chambers for carrying out corresponding processes are coupled via a shared transfer chamber.

Figure 11:
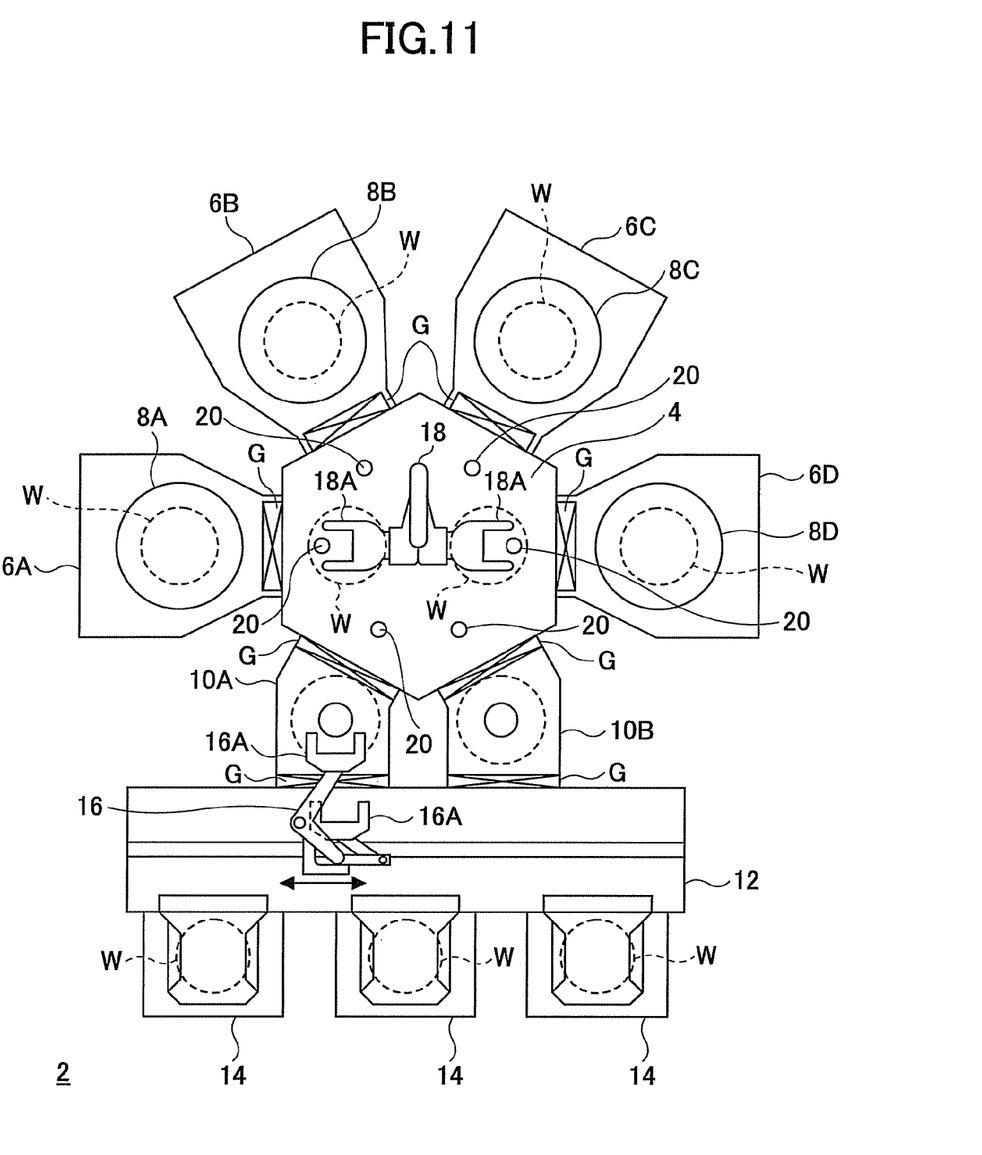
FIG. 11 is a schematic configuration view illustrating an example of a related-art process system.

FIG. 11 is a schematic configuration view illustrating an example of a related-art process system. As shown, a process system 2 includes plural (e.g., four) process chambers 6A through 6D that are coupled via corresponding gate valves G to, for example, a shared transfer chamber 4 evacuatable to vacuum. The process chambers 6A through 6D are provided with corresponding susceptors 8A through 8D, an upper surface of which the wafer is placed on.

In addition, load-lock chambers 10A, 10B are coupled on one side to the shared transfer chamber 4 via corresponding gate valves G, and on the other side to a loader chamber 12 via corresponding gate valves G. Load ports 14 are provided on one side surface of the loader chamber 12, in order to load unprocessed wafers housed in a cassette and the like. Transfer mechanisms 16, 18 including pivotable and bendable/stretchable multiple-joint arms are provided in the loader chamber 12 and the shared transfer chamber 4. The transfer mechanisms 16, 18 hold and transfer the wafer W.

In this case, when holding and transferring the wafer W with the transfer mechanisms 16, 18, the wafer W needs to be precisely positioned in an appropriate position on forks 16A, 18A at distal ends of the transfer mechanisms 16, 18, and held without positional deviation. To this end, plural positional deviation detection sensors are provided in a fixed manner in the shared transfer chamber 4 in order to detect positional deviation of the wafer W held by the transfer mechanism 18 (Patent Documents 1 through 4).

Patent Document 1: Japanese Patent Application Laid-Open Publication No. H10-223732
Patent Document 2: Japanese Patent Application Laid-Open Publication No. H10-247681
Patent Document 3: Japanese Patent Application Laid-Open Publication No. 2002-43394
Patent Document 4: Japanese Patent Application Laid-Open Publication No. 2004-140147

SUMMARY OF INVENTION

Problems to be Solved by the Invention

Because such positional deviation detection sensors 20 are provided in a fixed manner in the shared transfer chamber 4, if the positional deviation detection sensors 20 are positioned away from a transfer route of the wafer W, the wafer W is still caused to move above the positional deviation detection sensors 20, in order to detect positional deviation. This may lengthen the transfer route of the wafer W, leading to a reduced throughput. In addition, in order to prevent such reduced throughput, the positional deviation detection may be carried out at occasional times during a transferring operation of the wafer W, rather than at all the times during the transferring operation of the wafer W. However, in this case, if a relatively large positional deviation is caused when the positional deviation detection is not carried out, the wafer W may be subject to a collision, leading to a lack of reliability.

Moreover, the positional deviation may be detected using the positional deviation detection sensors provided in front of all the process chambers 6A through 6D when the wafer W is transferred out from the process chambers 6A through 6D. Such a configuration requires more positional deviation detection sensors 20, leading to a problem of an increased cost.

Moreover, there is a problem in that such positional deviation detection sensors 20 cannot be provided for the transfer mechanism 16 in the loader chamber 12, because there is not sufficient space in the loader chamber 12.

The present invention has been made, focusing attention on the above problem, in order to efficiently solve the problem. The objective of the present invention is to provide a positional deviation detection apparatus that enables detection of positional deviation of an object to be processed in a simple manner and configuration without reducing throughput by providing an edge detection unit on a part of arm portions connected in series with each other, and a process system employing the positional deviation detection apparatus.

Means of Solving the Problems

An invention according to claim 1 is a positional deviation detection apparatus provided with a transfer mechanism where plural arm portions are connected pivotably and in series with each other, the transfer mechanism being adapted to hold and transfer an object to be processed with a distal end arm portion, the positional deviation detection apparatus being characterized by: an edge detection unit that detects at least an edge of the object to be detected held by the distal end arm portion, the edge detection unit being provided in an arm portion among the plural arm portions, except for the distal end arm portion; and a positional deviation detection portion that obtains positional deviation of the object to be processed, in accordance with a detected value of the edge detection unit.

In this way, positional deviation of an object to be processed can be detected in a simple manner and configuration without reducing throughput by providing an edge detection unit on a part of arm portions connected in series with each other.

In this case, as recited in claim 2, the edge detection unit comprises two or more photoelectronic sensors arranged apart from each other.

In addition, as recited in, for example, claim 3, the photoelectronic sensors comprise a first optical element attached on a sensor attachment rod extending from the arm portion provided with the edge detection unit, and a second optical element attached on a body of the arm portion provided with the edge detection unit, the second optical element corresponding to the first optical element.

Moreover, as recited in, for example, claim 4, one of the first and the second optical elements is a light emitting element and the other is a light detection element.

Furthermore, as recited in, for example, claim 5, the photoelectronic sensors comprise a light emitting/receiving element attached on a sensor attachment rod extending from the arm portion provided with the edge detection unit.

In addition, as recited in, for example, claim 6, the sensor attachment rod is provided in parallel with a center axis of a longitudinal direction of the arm portion provided with the edge detection unit.

Moreover, as recited in, for example, claim 7, the distal end arm portion comprises one or plural independently pivotable forks.

Furthermore, as recited in claim 8, the positional deviation detection unit is adapted to stop the transfer mechanism when an amount of the positional deviation exceeds a permissible amount.

In addition, as recited in, for example, claim 9, the positional deviation detection unit is adapted to control an operation so that an amount of the positional deviation is compensated for.

Moreover, as recited in, for example, claim 10, the arm portion provided with the edge detection unit is an immediate previous arm with respect to the distal end arm portion.

Furthermore, as recited in, for example, claim 11, the edge detection unit detects positional deviation of the distal end arm portion.

An invention according to claim 12 is a process system characterized by: plural process chambers in which predetermined processes are performed with respect to an object to be processed; a shared transfer chamber coupled to the plural process chambers; a first transfer mechanism that transfers the object to be processed and is provided in the shared transfer chamber; an introduction chamber coupled to the shared transfer chamber via a load lock chamber; an introduction port that is provided for the introduction chamber and in which the object to be processed is placed; and a second transfer mechanism that transfers the object to be processed and is provided in the introduction chamber, wherein the first and/or the second transfer mechanisms is provided with the positional deviation detection apparatus recited in claim 1.

EFFECTS OF THE INVENTION

According to a positional deviation detection apparatus and a process system employing the same of an embodiment of the present invention, the following advantageous operational effects can be provided.

Positional deviation of an object to be processed can be detected in a simple manner and configuration without reducing throughput by providing an edge detection unit on a part of arm portions connected in series with each other.

DESCRIPTION OF THE REFERENCE NUMERALS

M0 placement center position
W0 wafer center position
W semiconductor wafer (an object to be processed)
22 processing system
24A through 24D process chambers
26 shared transfer chamber
28A, 28B load lock chambers
30 introduction chamber
34 first transfer mechanism
40 introduction port
48 second transfer mechanism
54 system controller
60 first arm portion
62 second arm portion
64 third arm portion
64A, 64B forks
66 positional deviation detection apparatus
68 edge detection unit
70 positional deviation detector
72, 74 photoelectronic sensors
72A, 74A first optical element
72B, 74B second optical element
76 sensor attachment rod

MODE(S) FOR CARRYING OUT THE INVENTION

Referring to the accompanying drawings, a positional deviation detection apparatus and a process system according to embodiments of the present invention are explained in the following.

Figure 1:
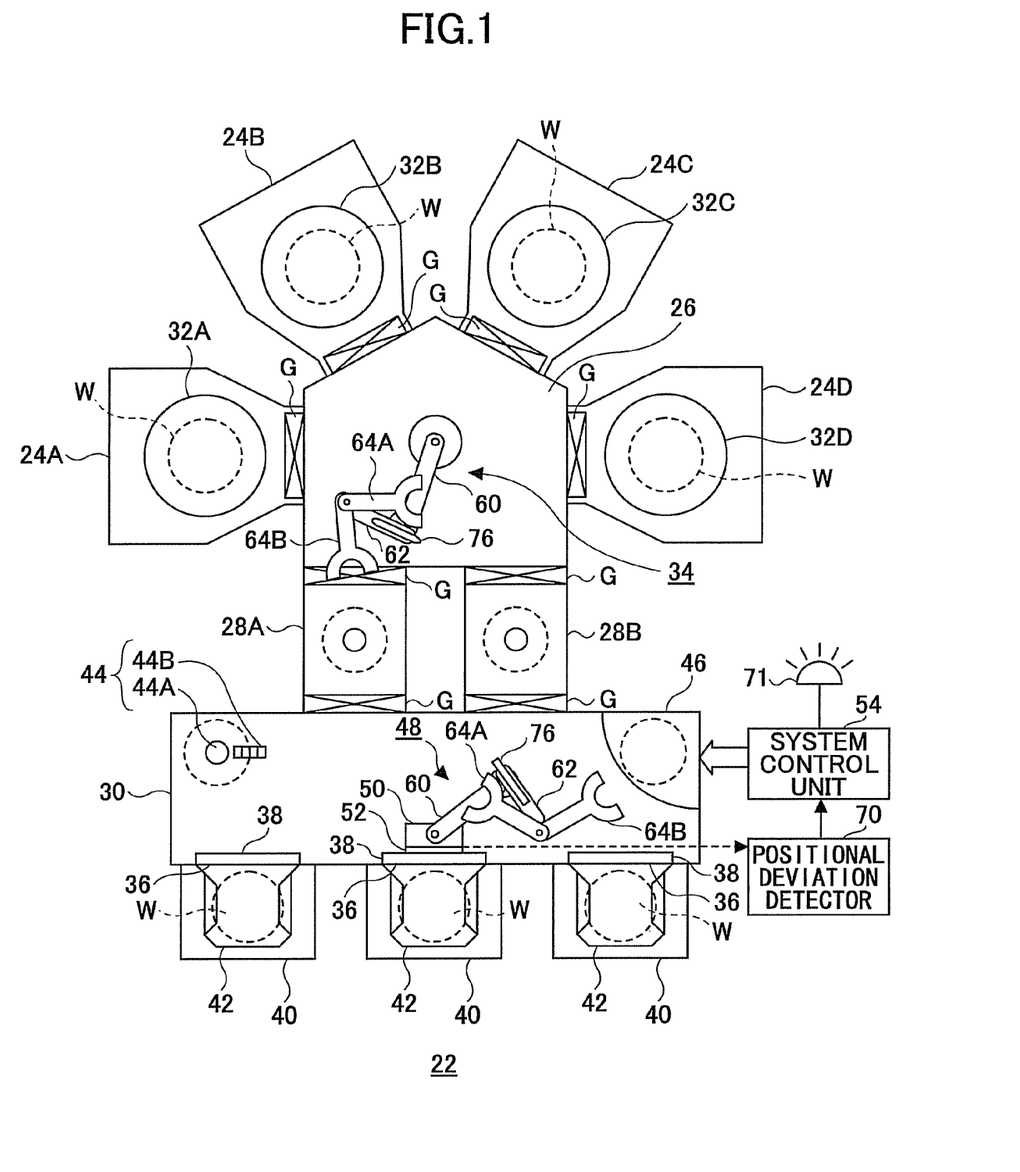
FIG. 1 is a schematic configuration view illustrating a positional deviation detection apparatus and a process system according to an embodiment of the present invention.
Figure 2:
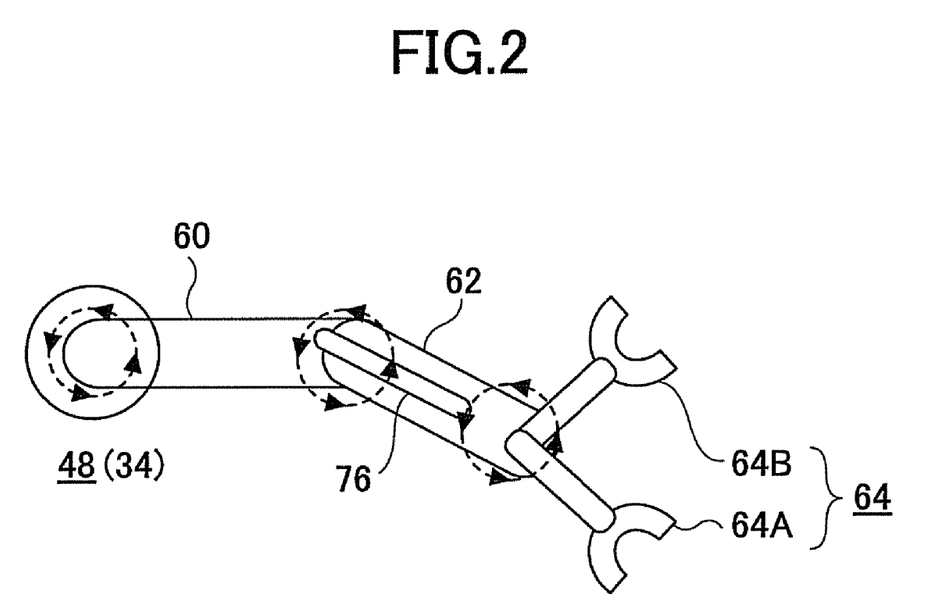
FIG. 2 is a schematic plan view illustrating a transfer mechanism for use in the embodiment of the present invention.
Figure 3:
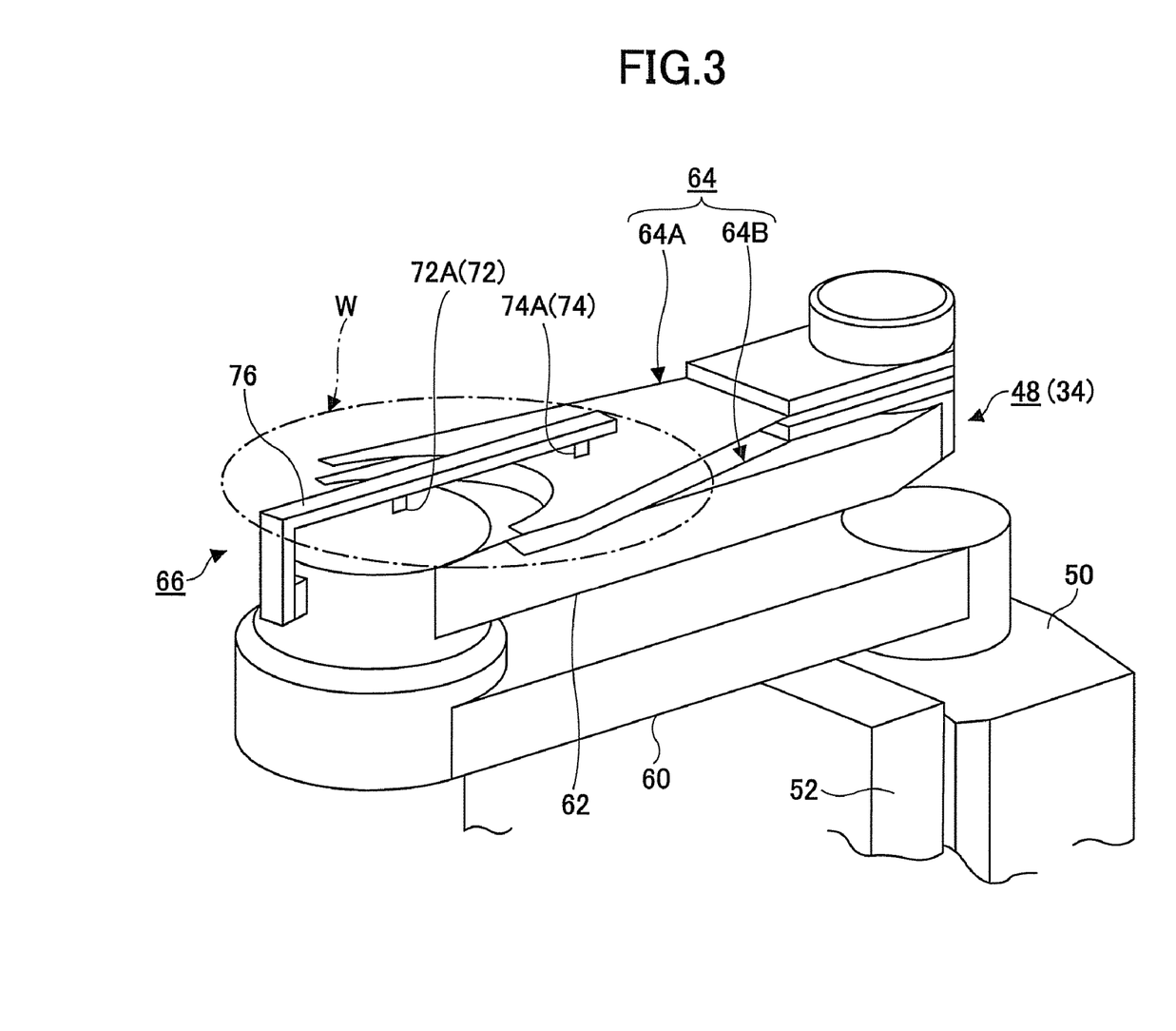
FIG. 3 is a partial perspective view illustrating an example of a transfer mechanism provided with a positional deviation detection apparatus.
Figure 4:
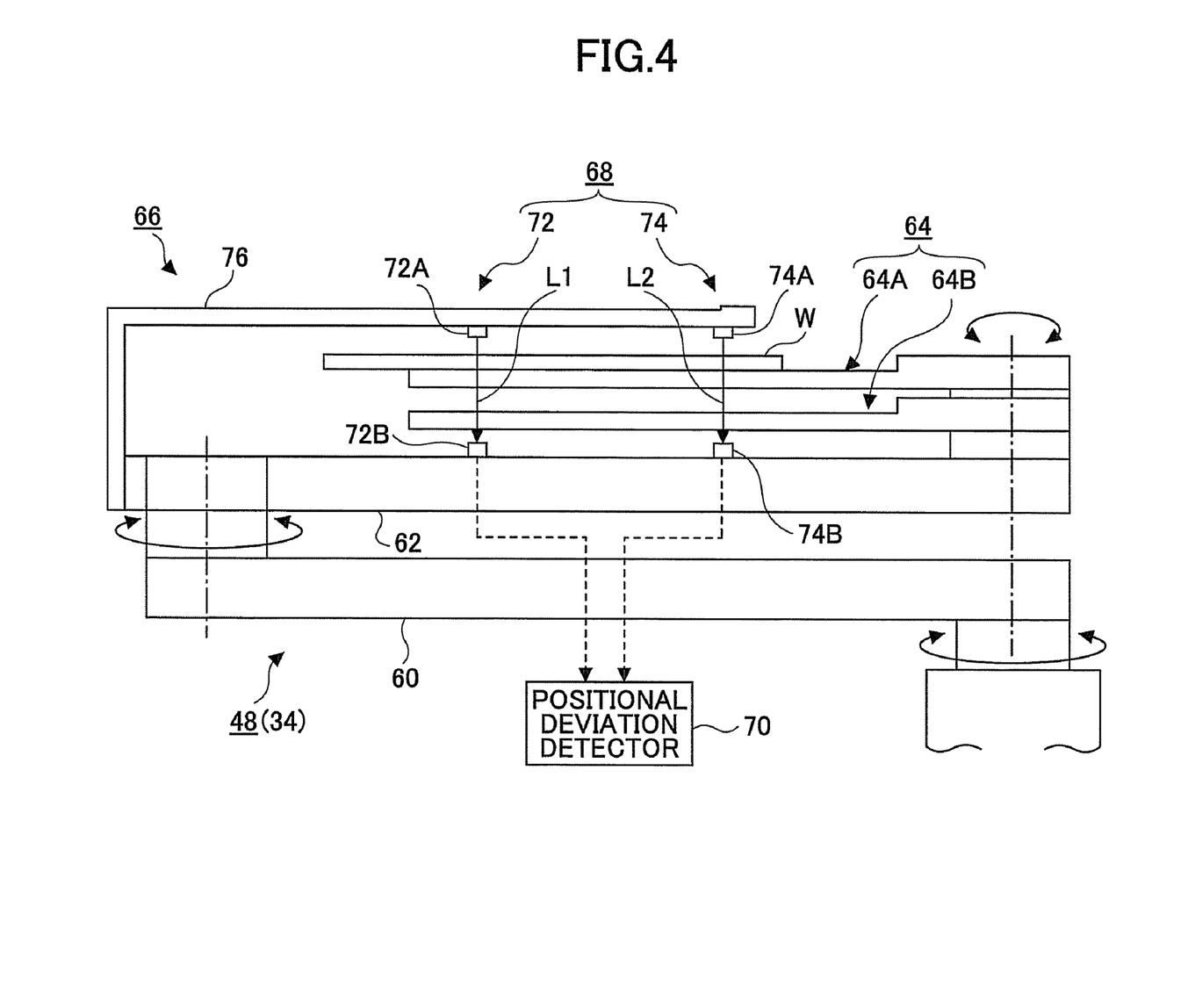
FIG. 4 is a side view illustrating the transfer mechanism that is kept folded back.
Figure 5:
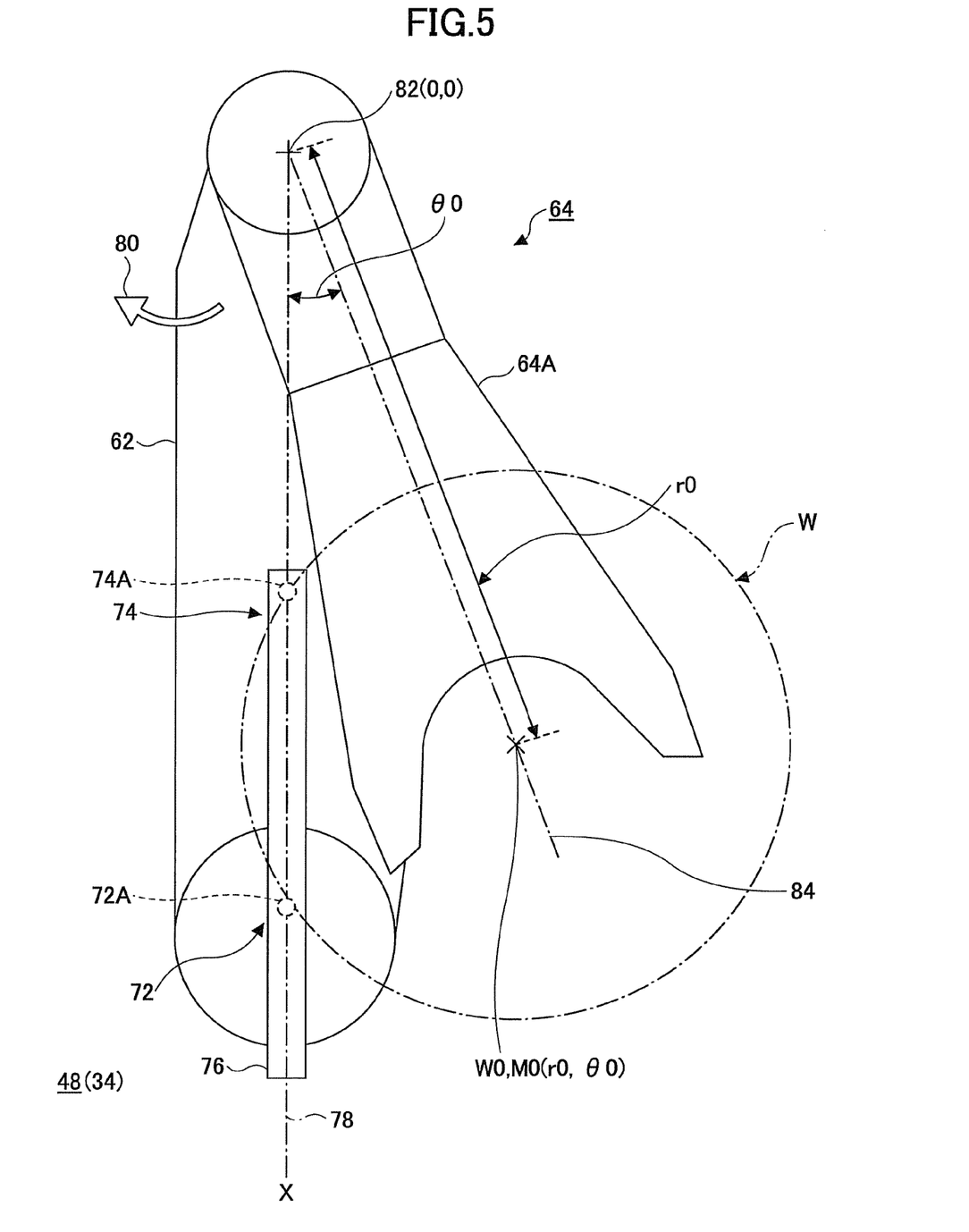
FIG. 5 is a plan view illustrating an operation when the transfer mechanism is folded back to block off light of an edge detection portion.
Figure 6:
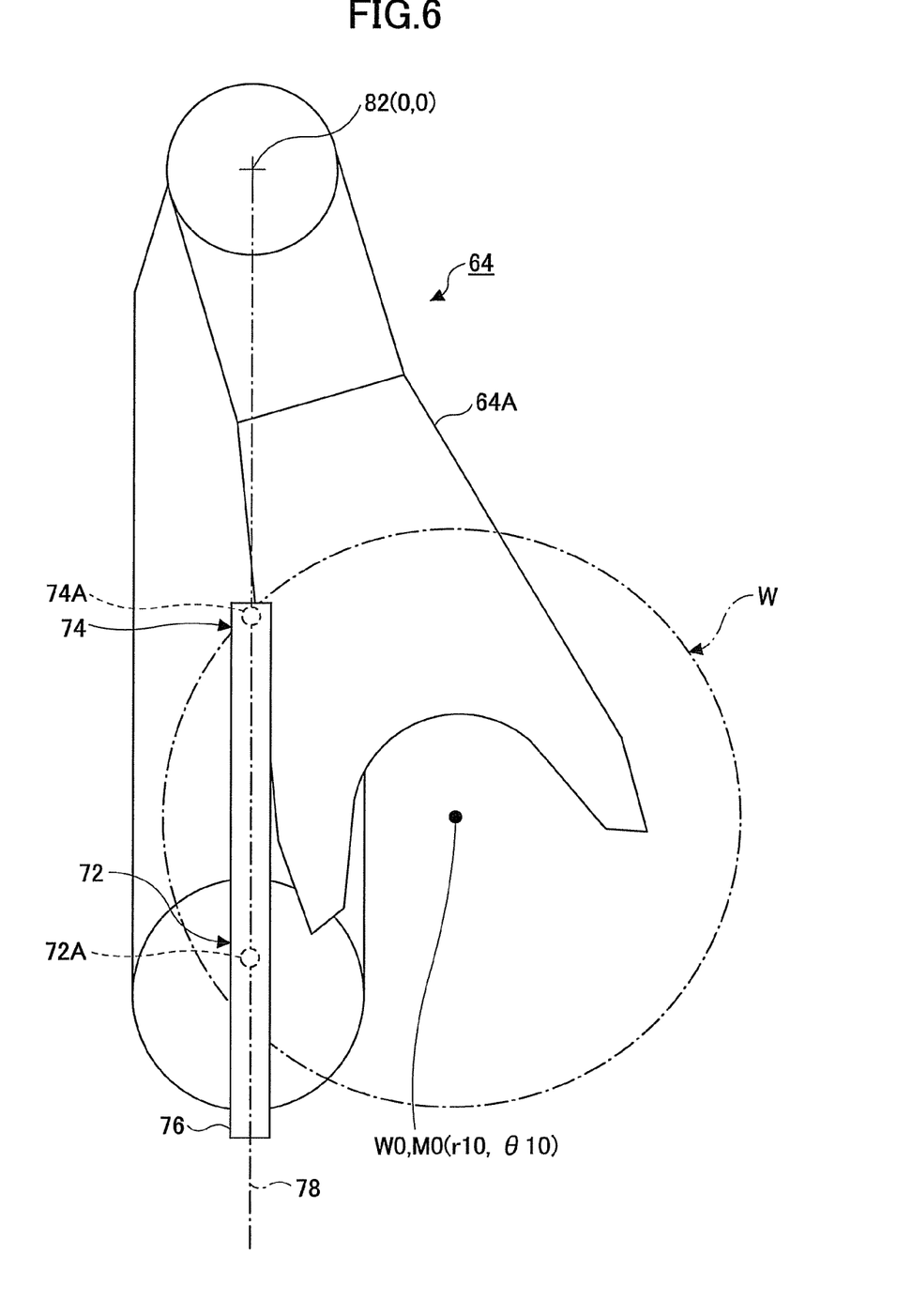
FIG. 6 is a plan view illustrating an operation when the transfer mechanism is folded back to block off light of the edge detection portion.

FIG. 1 is a schematic configuration view illustrating a positional deviation detection apparatus and a process system according to embodiments of the present invention; FIG. 2 is a schematic plan view of a transfer mechanism for use in the embodiment of the present invention; FIG. 3 is a partial perspective view illustrating an example of a transfer mechanism provided with a positional deviation detection apparatus; FIG. 4 is a side view illustrating the transfer mechanism that is kept folded back; and FIGS. 5 and 6 are plan views illustrating operations when the transfer mechanism is being folded back to interrupt light in an edge detection unit.

First, the process system is explained.

As shown in FIG. 1, a process system 22 includes plural, e.g., four process chambers 24A, 24B, 24C, 24D, a shared transfer chamber 26 having a pentagonal shape and evacuatable to vacuum, first and second load lock chambers 28A, 28B having load lock mechanisms that enable repetition of inner pressure changes to vacuum and back to atmospheric pressure, and an oblong introduction chamber 30 for an object to be processed.

Specifically, the process chambers 24A through 24D are coupled to corresponding four sides of the shared transfer chamber 26 having a pentagonal shape, and the first and the second load lock chambers 28A, 28B are coupled to the remaining side of the shared transfer chamber 26. The introduction chamber 30 is coupled to the other sides of the first and the second load lock chambers 28A, 28B. The shape of the shared transfer chamber 26 and/or the number of the process chambers are not limited to the above.

Corresponding gate valves G that may be opened and hermetically closed are interposed and coupled between the shared transfer chamber 26 and the four process chambers 24A through 24D and between the shared transfer chamber 26 and the first and the second load lock chambers 28A, 28B in order to configure a cluster tool, which enables pressure communication with the shared transfer chamber 26, when necessary. In addition, additional gate valves G that may be opened and hermetically closed are interposed between the first and the second load lock chambers 28A, 28B and the introduction chamber 30.

Inside the process chambers 24A through 24D, there are provided corresponding susceptors 32A through 32D on which the semiconductor wafer is placed, and the semiconductor wafer as an object to be processed may undergo various processes. In the shared transfer chamber 26, a first transfer mechanism 34 adapted to be foldable/stretchable and pivotable is provided at a position so that the first transfer mechanism 34 can access the two load lock chambers 28A, 28B and the four process chambers 24A through 24D in order to transfer the wafer W. Here, the first transfer mechanism 34 is adapted to handle two wafers at a time. Incidentally, a configuration of the first transfer mechanism 34 is explained later.

The introduction chamber 30 is formed of an oblong box-like object. One or plural (three, in the illustrated example) transfer-in ports 36 for transferring a semiconductor wafer as an object to be processed thereinto are provided on an oblong side. The transfer-in ports 36 are provided with corresponding openable/closable open/close doors 38. In addition, inside of the introduction chamber 30 is filled with clean air or an inert gas such as N2. Introduction ports 40 are provided for corresponding transfer-in ports 36, and, for example, cassettes 42 can be placed on the corresponding introduction ports 40. Each of the cassettes 42 may house plural (e.g., twenty five) unprocessed or processed substrates W one above another at the same pitch. Incidentally, the cassette 42 may be hermetically sealed, or a shelf type container.

In addition, an orienter 44 for carrying out wafer positioning is provided in one side of the introduction chamber 30. The orienter 44 includes a rotational pedestal 44A that rotates the wafer W placed thereon, and an optical sensor 44B composed of a line sensor, which makes it possible to detect a circumferential portion (edge) of the wafer W in order to detect positional deviation of the center of the wafer W.

A storage shelf 46 for temporarily storing the unprocessed or processed wafers transferred into the inside of the introduction chamber 30 is provided on the other side of the introduction chamber 30. The storage shelf 46 may store, for example, five wafers W. A second transfer mechanism 48 adapted to be foldable/stretchable and pivotable, which can access the load lock chambers 28A, 28B, the transfer-in ports 40, the orienter 44, and the storage shelf 46 in order to transfer the wafer W, is provided in the wall side in the center along a longitudinal direction of the introduction chamber 30. A base 50 of the second transfer mechanism 48 is slidably provided on a guide rail 52 along an upward/downward direction, and thus the second transfer mechanism 48 as a whole can be elevated.

Overall operations including processes in the corresponding process chambers 24A through 24D and operations of the first and the second transfer mechanisms 34, 48 and the like are controlled by, for example, a system controller 54 composed of a computer or the like.

(Configuration of the Transfer Mechanism)

Next, configurations of the first and the second transfer mechanisms 34, 48 and positional deviation detection apparatuses provided therein are explained. Because the first and the second transfer mechanism 34, 48 and the positional deviation detection apparatuses are configured in the same manner, only the second transfer mechanism 48 is explained, the same reference symbols are given to the first transfer mechanism 34, and explanation of the first transfer mechanism 34 is omitted.

As shown in FIGS. 2 through 6, the second transfer mechanism 48, which is configured in the same manner as the first transfer mechanism 34, has plural arm portions connected in parallel with and pivotable with one another, and can hold the semiconductor wafer W, which is an object to be processed, with a distal end arm portion in order to transfer the wafer W. Specifically, the second transfer apparatus 48 is composed of three-stage arm portions of a first arm portion 60 at a first stage, a second arm portion 62 at a second stage, and a third arm portion 64 at a third stage. A base end portion of the first arm portion 60 is rotatably supported by the base 50, and a distal end portion of the first arm portion 60 rotatably supports a base end portion of the second arm portion 62.

In addition, a distal end portion of the second arm portion 62 rotatably supports a base end portion of the third arm portion 64. The third arm portion 64 serves as the distal end arm portion, includes plural (two in the illustrated example) forks 64A, 64B arranged one above the other. The forks 64A, 64B have fork shapes at distal ends and are independently able to pivot, and transfer the wafers W by placing the wafers W on the forks 64A, 64B. Incidentally, the third arm portion 64 may be provided with one fork or three or more forks.

Therefore, the transfer mechanism 48 is adapted to be foldable/stretchable in arbitrary directions by pivoting the arm portions 60, 62, 64 around the corresponding support arms of the arm portions 60, 62, 64. In addition, belts, gears and the like are incorporated inside the transfer mechanism 48, and the second transfer mechanism 48 can be foldably/stretchably and pivotably driven by rotating the belts, the gears and the like in forward/reverse directions.

The second transfer mechanism 48 so configured is provided with a positional deviation detection apparatus 66 according to an embodiment of the present invention. The positional deviation detection apparatus 66 is provided on the arm portions except for the distal end arm portion, and is mainly composed of an edge detection unit 68 for detecting an edge of the wafer W held by the distal end arm portion, that is, the third arm portion 64, and a positional deviation detector 70 for obtaining position deviation of the wafer W in accordance with detection values of the edge detection unit 68. The detection result of the positional deviation detector 70 is input to the system controller 54 (FIG. 1), and the system controller 54 activates an alarm device 71 provided in the system controller 54, when necessary.

Specifically, the edge detection unit 68 is provided in the second arm portion 62, which is at an immediate previous stage of the third arm portion 64, and includes two photoelectronic sensors 72, 74 arranged at a predetermined distance apart from each other. Incidentally, the edge detection unit 68 may be provided with three photoelectronic sensors.

As shown in FIG. 4, the second arm portion 62 is provided at the base end portion with a sensor attachment rod 76, for attaching the photoelectronic sensors 72, 74 thereon, extending from the base end portion. The sensor attachment rod 76 is arranged along a center axis 78 (FIG. 5) of a longitudinal direction of the second arm portion 62, and spaced apart in an upward direction by a predetermined distance from a body of the second arm portion 62 in order not to interfere with the third arm portion 64 that holds the wafers W when the third arm portion 64 pivots.

First optical elements 72A, 74A constituting the corresponding photoelectronic sensors 72, 74 are arranged at a predetermined distance away from each other on the sensor attachment rod 76. In addition, second optical elements 72B, 74B are arranged in positions corresponding to the first optical elements 72A, 74A on the body of the second arm portion 62. Light emitting elements such as light emitting diodes and laser diodes may be used as the first optical elements 72A, 72B, and light detection elements are used as the second optical elements 72B, 74B. When rays L1, L2 (see FIG. 4) from the light emitting elements are interrupted, movement of the edge of the wafer W can be detected.

Incidentally, the attachment positions of the light emitting elements and the light detection elements may be reversed. The light detection elements may be used as the first optical elements 72A, 74A, and the light emitting elements may be used as the second optical elements 72B, 74B. At any rate, any configuration may be taken as long as interruption of the rays L1, L2 can be detected.

FIG. 5 illustrates a situation where the edge of the wafer W held by the fork 64A of the third arm portion 64 interrupts the rays in corresponding positions of the photoelectronic sensors 72, 74, and FIG. 6 illustrates a situation where the fork 64A further pivots in a direction of an arrow 80 in FIG. 5 from the situation illustrated in FIG. 5. Pivotal angles of the arm portions 60, 62, 64 are controlled by the system controller, and position deviation of the wafer W held by the third arm portion 64 is constantly monitored by the system controller 54 when the third arm portion 64 pivots.

Specifically, FIG. 5 illustrates a situation where a placement center position M0 of the upper fork 64A is in agreement with a center position W of the wafer W, so that the wafer W is held by the fork 64A without positional deviation, and the two photoelectronic sensors 72, 74 detect interruption of the rays at the same time. Incidentally, these two photoelectronic sensors 72, 74 may detect interruption of the rays at different timings when the wafer W is placed in an appropriate position, while the following explanation is made when the two photoelectronic sensors 72, 74 detect interruption of the rays at the same time.

In such a situation illustrated in FIG. 5, a pivotal center 82 of the third arm portion 64 is assumed to be an original point (0, 0), and the center axis 78 of the second arm portion 62 is assumed to be an X axis. In addition, an angle formed by a center axis 84 along a longitudinal direction of the fork 64A and the X axis, which is the center axis 78 of the second arm portion 62, is assumed to be a reference angle. The placement center position M0 at this time is stored as a reference polar coordinate point (r0, θ0) by the system controller 54 in advance. Incidentally, a diameter of the wafer W, a distance r0 between the pivotal center 82 and the placement center position M0, a distance between the pivotal center 82 and the photoelectronic sensors 72, 74, and the like are also stored by the system controller 54 in advance.

In addition, values regarding the other fork 64B are also stored by the system controller 54 in advance. In this case, the above values regarding the forks 64A, 64B are equal to one another. Explanations about the polar coordinates regarding the second transfer mechanism 48 can be applied to the first transfer mechanism 34.

Next, movement of the semiconductor wafer W in the process system 22 configured in the above manner is explained.

First, the cassette 42 housing unprocessed wafer W to be processed next is placed on one of the introduction ports 40 of the introduction chamber 30. Alternatively, the unprocessed wafer W has already been transferred into the introduction chamber 30 and may be stored in the storage shelf 46.

In order to transfer the wafer W, the second transfer mechanism 48 provided in the introduction chamber 30 accesses the introduction port 40 or the storage port 46, and one of the forks 64A, 64B of the third arm portion 64, for example, the fork 64A holds the unprocessed wafer W. An orientation flat or a notch made in the held wafer W is used to detect positional deviation or positional direction. Incidentally, when there is the wafer W that has already gone through the orienter 44 and thus the positioning has been carried out with respect to the wafer W, the positioned wafer W is taken out by the other (vacant) fork 64A, and the wafer W held by the fork 64A may be transferred to the orienter 44 for positioning.

The wafer W that undergoes the positioning in the orienter 44 is transferred into one of the first and the second load lock chambers 28A, 28B by the second transfer mechanism 48, and placed therein.

Next, the load lock chamber housing the wafer W is closed and evacuated to vacuum, and the gate valve G is opened, so that this load lock chamber becomes in pressure communication with the shared transfer chamber 26 that has been kept under vacuum in advance.

Next, the first mechanism 34 in the shared transfer chamber 26 is used to access the load lock chamber in pressure communication with the shared transfer chamber 26 and the unprocessed wafer W is picked up by one of the forks 64A, 64B. Then, the wafer W is transferred into one of the four process chambers 24A through 24D in order for the wafer W to undergo a process to be carried out for the wafer W, for example, the process chamber 24A, and transferred on a susceptor in the process chamber 24A. Subsequently, the gate valve G is closed in order to seal the process chamber 24, and a predetermined process is carried out with respect to the wafer W.

Then, when the wafer W is further processed in the other process chambers 24B through 24D, the wafer W is transferred to the corresponding process chambers 24B through 24D one after another by the first transfer mechanism 34 and undergoes the corresponding processes.

When a series of the processes carried out for the wafer W is completed, the processed wafer W is transferred into one of the two load lock chambers 28A, 28B by the first transfer mechanism 34. Then, after the load lock chamber is returned back to an atmospheric pressure, the processed wafer W is transferred out to the introduction chamber 30 by using the second transfer mechanism 48, and further stored in the storing shelf 46 or transferred into the cassette 42 placed on the introduction port 40. With this, a series of transfer operations is completed.

When the wafer W is transferred by the first and the second transfer mechanisms 34, 48 in such a manner, the transfer mechanisms 34, 48 are folded while holding the wafer W in order to avoid interference with other members, and pivot as a whole in this situation. At this time, it is detected whether the wafer W is held in an appropriate position on the third arm portion 64. Namely, positional deviation detection is carried out.

In this case, as shown in FIGS. 5 and 6, when the third arm portion 64 is folded while the fork 64A, for example, of the third arm portion 64 is holding the wafer W, the rays L1, L2 of the two photoelectronic sensors 72, 74 are interrupted by the edge (and around area thereof) of the wafer W (see FIG. 4) as the third arm portion 64 is being folded. Therefore, it can be determined by detection timing of the interruption, specifically, a pivotal angle of the third arm portion 64 (fork 64A) whether the wafer W is placed on the fork 64A without deviation.

Figure 7:
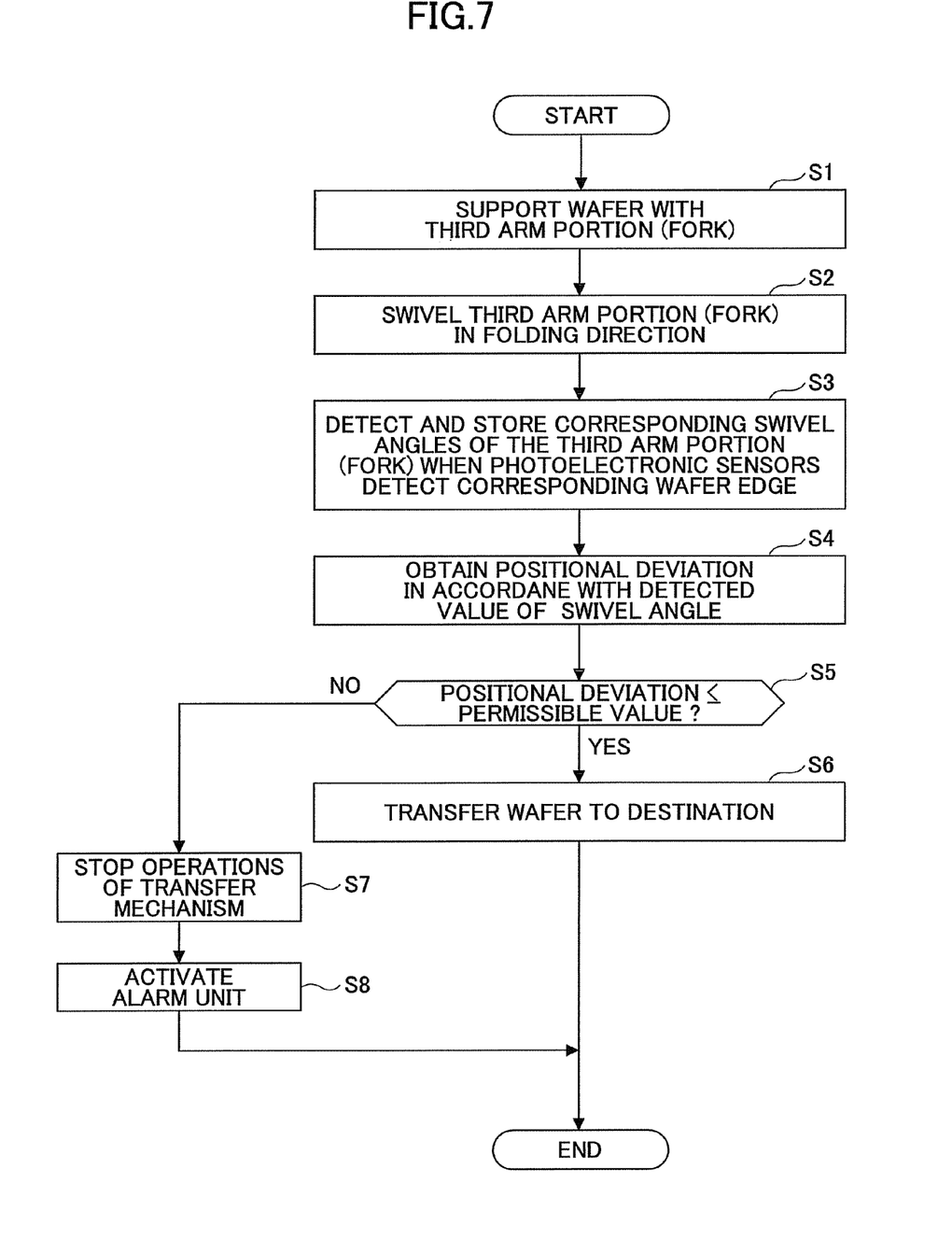
FIG. 7 is a flowchart illustrating an operation for detecting positional deviation of a semiconductor wafer held by a fork.
Figure 8:
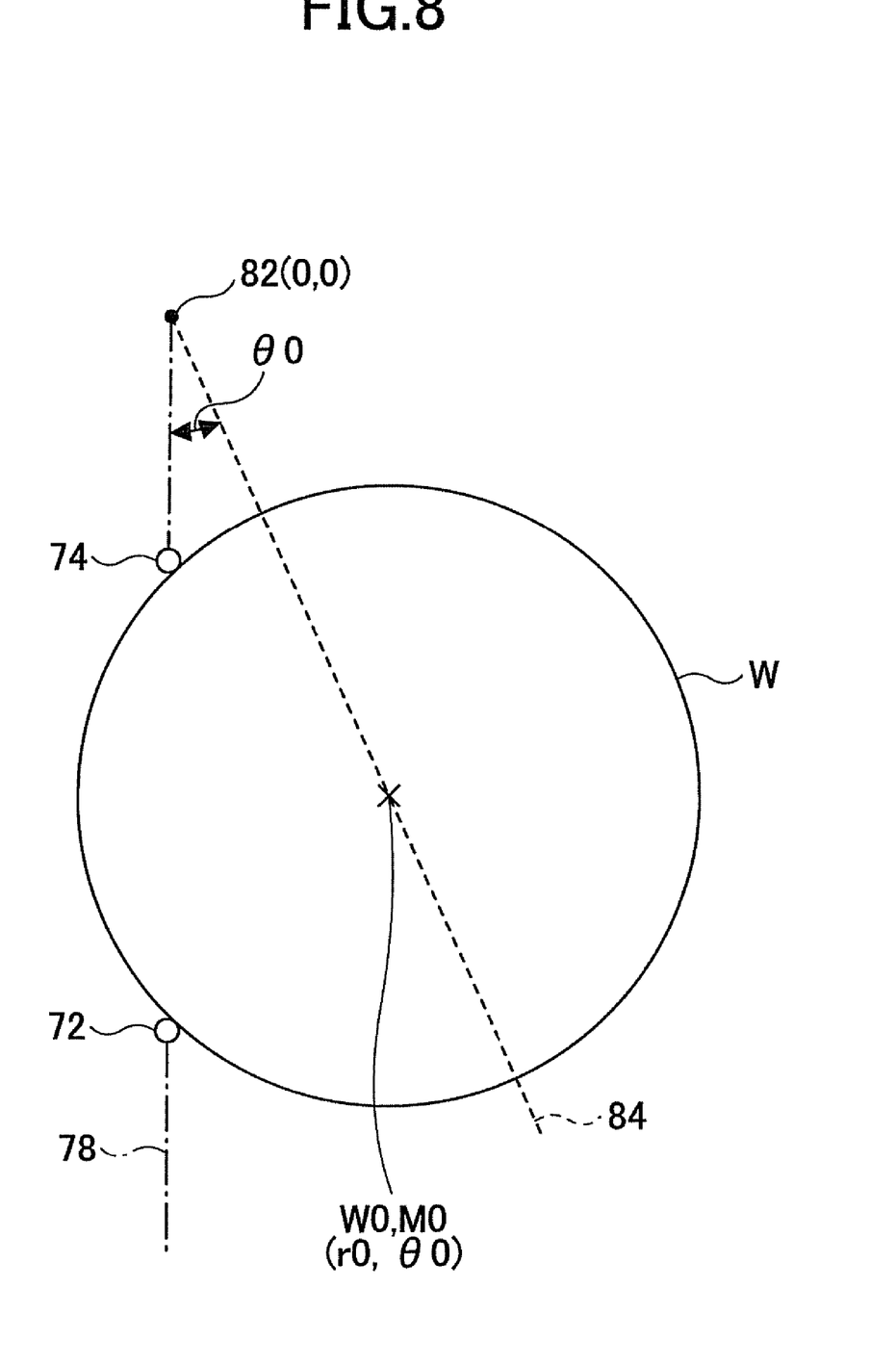
FIG. 8 illustrates a semiconductor wafer held in an appropriate position without positional deviation.
Figure 9:
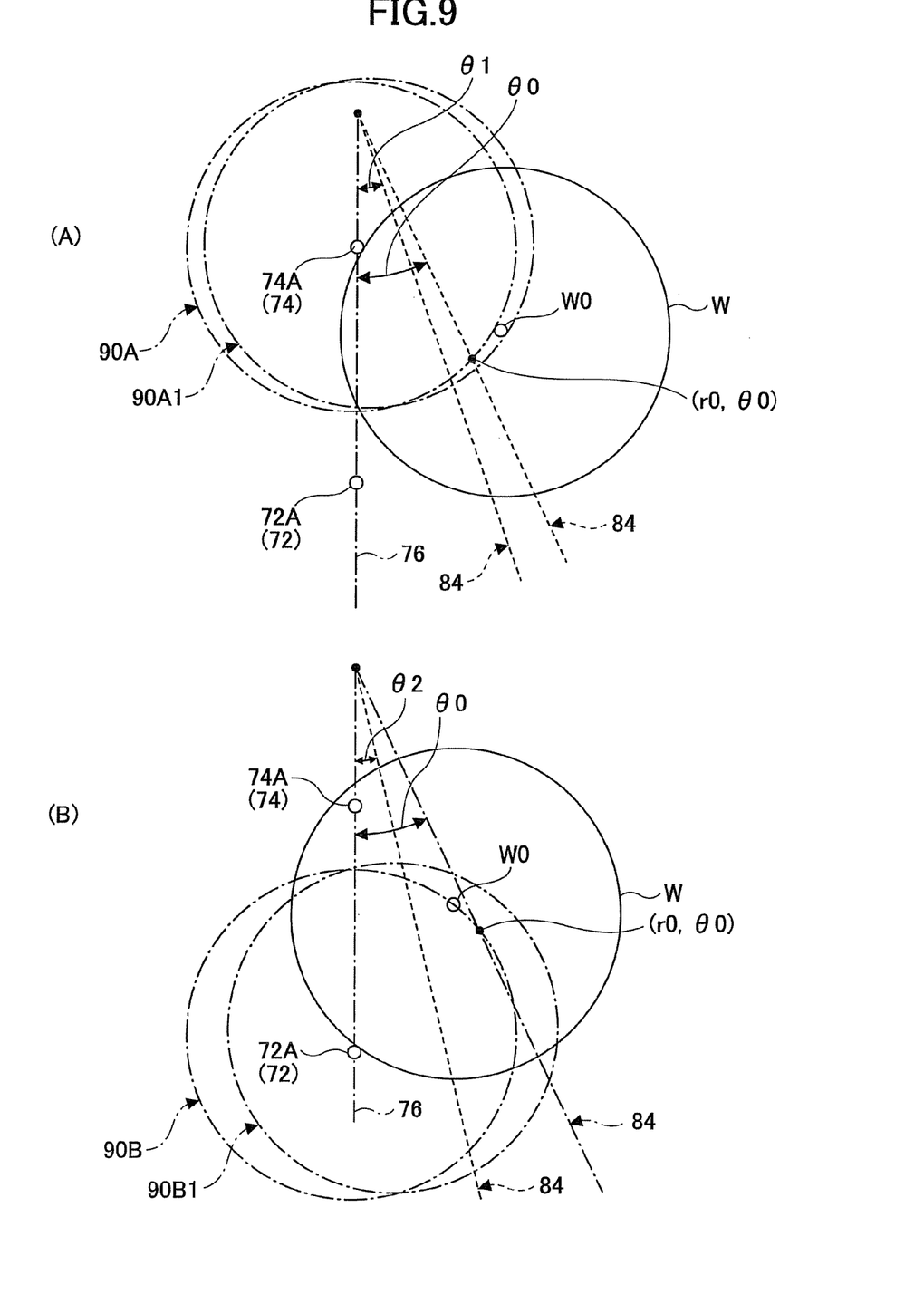
FIG. 9 illustrates an example of a semiconductor wafer held with positional deviation.

The above operations are further explained. FIG. 7 is a flowchart illustrating operations for detecting positional deviation of the semiconductor wafer held by the fork; FIG. 8 illustrates a situation where the semiconductor wafer is held in an appropriate position without deviation; and FIG. 9 illustrates an example of the semiconductor wafer held with positional deviation. Incidentally, matters illustrated in FIGS. 7 through 9 can be applied to the first and the second transfer mechanisms 34, 48.

First, an operation flow at the time of detecting positional deviation is explained based on the flowchart illustrated in FIG. 7. When the wafer W is held by the fork 64A, for example, of the third arm portion 64 of the transfer mechanisms 34, 48 (S1), the third arm portion 64 pivots in a folding direction (S2). At this time, as shown in FIGS. 5 and 6, the rays L1, L2 (see FIG. 4) generated by the photoelectronic sensors 72, 74 are interrupted by the edge of the wafer W, and thus pivotal angles of the fork 64A of the third arm portion 64 at the time of the interruption are stored (S3). This storing is carried out by a memory (not shown) of the positional deviation detector 70.

Then, the positional deviation detector 70 obtains polar coordinates (r10, θ10) of the center position (placement position) of the wafer W at the time of the pivotal angle being "θ0" (see FIG. 6). Next, a difference between the polar coordinates (r10, θ10) and the reference polar coordinates (r0, θ0) obtained when the wafer W is held in an appropriate position without positional deviation on the fork 564A, namely, an amount of positional deviation is obtained (S4). Incidentally, the reference polar coordinates (r0, θ0) are stored in advance by the positional deviation detector 70.

Next, the amount of the positional deviation is sent to, for example, the system controller 54, and it is determined by the system controller 54 whether the amount of the positional deviation falls within a permissible range stored in advance (S5). In the case of YES, namely, when the amount of the positional deviation falls within the permissible range, the wafer W does not interfere with other members, and thus the operations of the transfer mechanism are continued, so that the wafer W is transferred to a destination (S6).

On the contrary, in the case of NO at Step S5, namely, when the amount of the positional deviation is larger than a permissible value, the operations of the transfer mechanism comes to a stop (S7) because the wafer W may interfere with other members, which is a cause for reduced yields, when the operations are continued, and the alarm unit 71 (see FIG. 1) is activated in order to inform an operator accordingly (S8). Incidentally, the operations at Steps S5, S7, S8 may be carried out by the positional deviation detector 70. In addition, when the amount of the positional deviation is obtained at Step S4, the transfer mechanism 48 may carry out corrective operations for compensating for the amount of the positional deviation, according to which the wafer W may be transferred to a destination.

An example of processes carried out until an amount of positional deviation is obtained in Steps S3 and S4 is explained with reference to FIGS. 8 and 9. FIG. 8 schematically illustrates the situation illustrated in FIG. 5, and FIG. 9 illustrates a situation where the wafer W is held with deviation on the fork. As stated above, when the placement center position M0 of the fork 64A and the center of the wafer W0 are in agreement with each other, the two photoelectronic sensors 72, 74 positioned along the center axis 78 of the second arm portion 62 (see FIG. 5) detect the edge of the wafer W at the same time. Here, the polar coordinates of the pivotal center 82 of the fork 64A indicate the original point (0, 0), and the reference polar coordinates indicate (r0, θ0).

Next, as shown in FIG. 9, when the wafer W is held with deviation in relation to the fork 64A, the rays of the photoelectronic sensors 72, 74 are interrupted at different timings (pivotal angles), for example, as shown in FIGS. 9(A) and 9(B). For example, the ray of the photoelectronic sensor 74 is interrupted when the pivotal angle of the center axis 84 of the fork 64A is "θ1", as shown in FIG. 9(A) and the ray of the photoelectronic sensor 72 is interrupted when the pivotal angle of the center axis 84 of the fork 64A is "θ2", as shown in FIG. 9(B).

Under such a situation, a circle 90A having a radius R, which corresponds to a radius of the wafer W, is drawn with the photoelectronic sensor 74, whose ray is interrupted, at the center, in the case of FIG. 9(A), and a circle 90B having a radius R is drawn with the photoelectronic sensor 72 at the center. In this case, the center W0 of the wafer W is positioned on circumferences of the circles 90A, 90B. Next, as far as the circle 90A in FIG. 9(A) is concerned, the circle 90A is pivotally shifted so that "θ1" becomes "θ0". Namely, the circle 90A is pivoted counterclockwise by an angle of "θ1-θ0" to make a circle 90A1.

In the same manner, as long as the circle 90B is concerned, the circle 90B is pivotally shifted so that "θ2" becomes "θ0". Namely, the circle 90B is pivoted counterclockwise by an angle of "θ0-θ2" to make a circle 90B1. While there are two intersection points of the two circles 90A1 and 90B1, one of the intersection points that greatly departs from the inside of the fork 64A, which is theoretically impossible, is neglected, and the other of the intersection points is the center position of the wafer W at the time of the pivotal angle of the fork 64A being "θ0". The polar coordinates of the center position W0 of the wafer W at this time are "r10, θ10". (see FIG. 6).

As a result, the difference between the polar coordinates (r10, θ10) of the deviated wafer W and the reference polar coordinates (r0, θ0) becomes the positional deviation. This positional deviation amount may be easily obtained by computation through a computer program. The above method of computation is explained merely as an example, and any other method of computation may be used. Such positional deviation detection is carried out for each of the forks 64A, 64B of the transfer mechanisms 34, 48, as stated above. In this way, according to an embodiment of the present invention, the positional deviation of the semiconductor wafer W as an object to be detected can be easily detected with a simple configuration without decreasing throughput by providing a part of the arm portions connected in series with each other, for example, the second arm portion 62 with the edge detection unit 68.

Incidentally, the edge detection unit 68 including the photoelectronic sensors 72, 74 is provided in the second arm portion 62, which is an immediately previous stage of the third arm that holds the wafer W in the above embodiment, but not being limited to this, may be provided with the arms except for the third arm portion 64, for example, the first arm portion 60.

In addition, while a so-called transmission type photoelectronic sensor separately having the light emitting element and the light detection element as the first and the second photoelectronic elements is used as the photoelectronic sensors 72, 74, not being limited to this, a reflection type photoelectronic sensor composed of the light emitting element and the light detection element integrated together may be used. In this case, movement of the wafer edge is detected due to a difference in reflectance between an upper surface of the wafer and an upper surface of the second arm portion 62.

Figure 10:
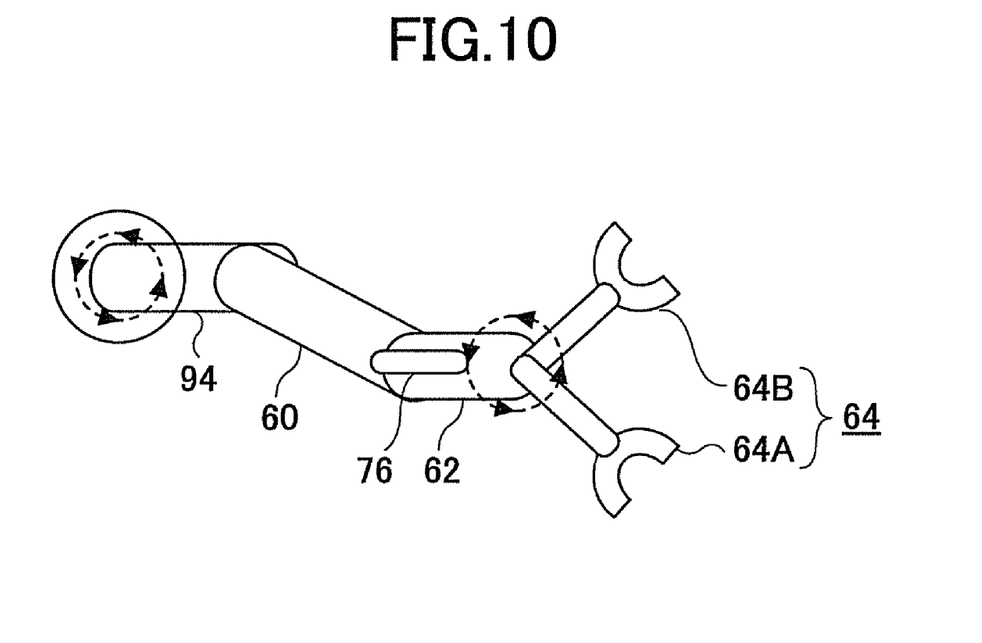
FIG. 10 illustrates a modification example of the transfer mechanism.

Moreover, while the three-stage arm portions 60, 62, 64 connected in series are explained as the transfer mechanism, as shown in FIG. 2, not being limited to this, two-stage arm portions, four-stage arm portions by further adding one-stage arm portion 94 as shown in FIG. 10, or more stage arm portions may be connected.

Furthermore, while the positional deviation of the wafer W is detected here, an amount of pivotal deviation of the forks 64A, 64B, which may be caused over time, can be detected by storing polar coordinates (reference polar coordinate) when an edge of the forks 64A, 64B of the third arm portion 64 interrupts either one of the rays. In this case, only one ray is sufficient in order to detect the amount of the pivotal deviation, and two rays are not necessary. Such an amount of the pivotal deviation may be easily carried out only by installing simple computer software.

In addition, while the positional deviation detection apparatuses are provided in both the first and the second transfer mechanisms 34, 48, not being limited to this, the positional deviation detection apparatus may be provided in one of the transfer mechanisms.

Moreover, while the semiconductor wafer is exemplified as an example of an object to be processed, the present invention is applicable to a glass substrate, a liquid crystal display (LCD) substrate, a ceramic substrate and the like.

This application is based on Japanese Priority Patent Application No. 2007-155506 filed Jun. 12, 2007 with the Japanese Patent Office, the entire content of which is hereby incorporated by reference.

The invention claimed is:

1. A positional deviation detection apparatus provided with a transfer mechanism where plural arm portions are connected pivotably and directly in series with each other, the transfer mechanism being adapted to hold and transfer an object to be processed with a distal end arm portion, the positional deviation detection apparatus comprising:
    an edge detection unit that detects at least an edge of the object to be detected held by the distal end arm portion, the edge detection unit being provided in an arm portion among the plural arm portions, except for the distal end arm portion, the distal end arm portion and the edge detection unit being provided in different planes paral­lel to each other, the distal end arm portion and the edge detection unit being pivotally movable in the planes respectively to be able to overlap with each other; and
    a positional deviation detection portion that obtains positional deviation of the object to be processed, in accordance with a detected value of the edge detection unit.

2. The positional deviation detection apparatus recited in claim 1, wherein the edge detection unit comprises two or more photoelectronic sensors arranged apart from each other.

3. The positional deviation detection apparatus recited in claim 2, wherein the photoelectronic sensors comprise a first optical element attached on a sensor attachment rod extending from the ann portion provided with the edge detection unit, and a second optical element attached on a body of the ann portion provided with the edge detection unit, the second optical element corresponding to the first optical element.

4. The positional deviation detection apparatus recited in china 3, wherein one of the first and the second optical elements is a light emitting element and the other is a light detection element.

5. The positional deviation detection apparatus recited in claim 3, wherein the sensor attachment rod is provided in parallel with a center axis of a longitudinal direction of the arm portion provided with the edge detection unit.

6. The positional deviation detection apparatus recited in claim 2, wherein the photoelectronic sensors comprise a light emitting/receiving element attached on a sensor attachment rod extending from the arm portion provided with the edge detection unit.

7. The positional deviation detection apparatus recited in claim 1, wherein the distal end arm portion comprises one or plural independently pivotable forks.

8. The positional deviation detection apparatus recited in claim 1, wherein the positional deviation detection unit is adapted to stop the transfer mechanism when an amount of the positional deviation exceeds a permissible amount.

9. The positional deviation detection apparatus recited in claim 1, wherein the positional deviation detection unit is adapted to control an operation so that an amount of the positional deviation is compensated for.

10. The positional deviation detection apparatus recited in claim 1, wherein the arm portion provided with the edge detection unit is an immediate previous arm with respect to the distal end arm portion.

11. The positional deviation detection apparatus recited in claim 1, wherein the edge detection unit detects positional deviation of the distal end arm portion.

12. A process system comprising:
    plural process chambers in which predetermined processes are performed with respect to an object to be processed;
    a shared transfer chamber coupled to the plural process chambers;
    a first transfer mechanism that transfers the object to be processed and is provided in the shared transfer chamber;
    an introduction chamber coupled to the shared transfer chamber via a load lock chamber;
    an introduction port that is provided for the introduction chamber and in which the object to be processed is placed; and
    a second transfer mechanism that transfers the object to be processed and is provided in the introduction chamber, wherein the first and/or the second transfer mechanisms is provided with the positional deviation detection apparatus recited in claim 1.

* * * * *